United States Patent
Bhalla et al.

(10) Patent No.: US 9,324,807 B1
(45) Date of Patent: Apr. 26, 2016

(54) SILICON CARBIDE MOSFET WITH INTEGRATED MOS DIODE

(71) Applicant: United Silicon Carbide, Inc., Monmouth Junction, NJ (US)

(72) Inventors: Anup Bhalla, Princeton Junction, NJ (US); Leonid Fursin, Monmouth Junction, NJ (US)

(73) Assignee: United Silicon Carbide, Inc., Monmouth Junction, NJ (US)

( * ) Notice: Subject to any disclaimer, the term of this patent is extended or adjusted under 35 U.S.C. 154(b) by 0 days.

(21) Appl. No.: 14/796,142

(22) Filed: Jul. 10, 2015

(51) Int. Cl.
| | |
|---|---|
| *H01L 29/16* | (2006.01) |
| *H01L 29/10* | (2006.01) |
| *H01L 29/167* | (2006.01) |
| *H01L 29/49* | (2006.01) |
| *H01L 29/51* | (2006.01) |
| *H01L 29/423* | (2006.01) |
| *H01L 29/40* | (2006.01) |
| *H01L 29/78* | (2006.01) |
| *H01L 29/739* | (2006.01) |
| *H01L 27/06* | (2006.01) |

(52) U.S. Cl.
CPC ........ *H01L 29/1608* (2013.01); *H01L 27/0629* (2013.01); *H01L 29/1095* (2013.01); *H01L 29/167* (2013.01); *H01L 29/407* (2013.01); *H01L 29/42312* (2013.01); *H01L 29/4916* (2013.01); *H01L 29/51* (2013.01); *H01L 29/7391* (2013.01); *H01L 29/7813* (2013.01)

(58) Field of Classification Search
CPC ............ H01L 29/1608; H01L 27/7391; H01L 29/407; H01L 29/1095; H01L 27/0629; H01L 29/167; H01L 29/51; H01L 29/7813; H01L 29/4916

See application file for complete search history.

(56) References Cited

U.S. PATENT DOCUMENTS

| | | | | | |
|---|---|---|---|---|---|
| 6,969,887 | B2* | 11/2005 | Mizukami | ........... | H01L 29/0623 257/330 |
| 7,078,782 | B2* | 7/2006 | Shirai | ................... | H01L 29/475 257/314 |
| 8,891,266 | B2* | 11/2014 | Bedell | .................... | H02M 7/106 257/76 |
| 2010/0006848 | A1* | 1/2010 | Fukuoka | ............. | H01L 27/0255 257/66 |
| 2011/0025406 | A1* | 2/2011 | Kanschat | ............ | H01L 29/0619 327/534 |
| 2011/0244644 | A1* | 10/2011 | Zuniga | ............ | H01L 21/823418 438/286 |
| 2013/0168700 | A1* | 7/2013 | Furukawa | ........... | H01L 29/7805 257/77 |
| 2014/0145290 | A1* | 5/2014 | Gu | .................... | H01L 29/66143 257/484 |
| 2015/0084125 | A1* | 3/2015 | Pala | .................. | H01L 21/26506 257/334 |

* cited by examiner

*Primary Examiner* — William Coleman
(74) *Attorney, Agent, or Firm* — Baker & Hostetler LLP

(57) ABSTRACT

A monolithically integrated MOS channel in gate-source shorted mode is used as a diode for the third quadrant conduction path for a power MOSFET. The MOS diode and MOSFET can be constructed in a variety of configurations including split-cell and trench. The devices may be formed of silicon carbide, gallium nitride, aluminum nitride, aluminum gallium nitride, diamond, or similar semiconductor. Low storage capacitance and low knee voltage for the MOS diode can be achieved by a variety of means. The MOS diode may be implemented with channel mobility enhancement materials, and/or have a very thin/high permittivity gate dielectric. The MOSFET gate conductor and MOS diode gate conductor may be made of polysilicon doped with opposite dopant types. The surface of the MOS diode dielectric may be implanted with cesium.

30 Claims, 10 Drawing Sheets

SILICON CARBIDE MOSFET WITH INTEGRATED MOS DIODE

FIELD OF THE DISCLOSURE

This disclosure is in the field of high-current and high-voltage metal oxide field effect transistors (MOSFETs) made from such materials as silicon carbide (SiC), gallium nitride (GaN), aluminum nitride (AlN), aluminum gallium nitride (AlGaN), and diamond. MOSFETs with integrated diodes and methods of making the same are disclosed.

BACKGROUND

High-current and high voltage MOSFETs with integrated diodes made from SiC, GaN, and other materials are useful in power electronic circuits, such as power factor correction (PFC) devices, DC-DC converters, DC-AC inverters, overcurrent and overvoltage protection circuits, and motor drives.

In many prior art SiC and GaN MOSFETs used in power electronic circuits, for example, the built-in body diode is used to carry the third quadrant/freewheeling current. However, this practice suffers from three major limitations. The body diode has a high knee voltage before the onset of conduction, leading to high conduction losses. The body diode also has a significant amount of stored charge which increases with temperature, removal of which leads to turn-on losses in adjacent devices. Finally, if the body diode is allowed to conduct, the recombination that occurs in electron-hole plasma in the device may result in progressive device degradation by causing an expansion of basal plane defects in the crystal in the case of SiC. This degradation manifests as an increase in leakage current and on-state voltage drop, causing the devices to dissipate more in losses as they age, and can eventually lead to catastrophic destruction.

Another prior art approach is to connect a separate SiC junction barrier Schottky (JBS) diode in parallel with the MOSFET to carry the third quadrant current. Yet another technique is to integrate a JBS diode within the MOSFET chip monolithically, so that, at least at typical operating currents, the forward voltage drop is less than the PN junction turn-on voltage, no bipolar injection occurs, so there is no stored charge loss, and no basal plane degradation. However, integrating a JBS diode limits the knee voltage based on the Schottky diode barrier height.

SUMMARY OF THE INVENTION

This invention uses a MOS channel in gate-source shorted mode used as a diode for the third quadrant conduction path. This MOS diode can be monolithically integrated with MOSFET devices, including split-cell and trench MOSFETs, whereby the MOS diode may be constructed using many of the same process steps used to make the MOSFET. The MOSFET and the MOS diode may both be formed on a common substrate of silicon carbide, gallium nitride, aluminum nitride, aluminum gallium nitride, diamond, or other semiconductor material.

The threshold voltage of the MOS diode can be used to develop a lower knee voltage. The threshold of the MOS diode can be substantially smaller than that of the MOSFET. The MOS diode may be implemented with channel mobility enhancement materials and/or higher dielectric constant gate materials. The MOS diode may have a very thin gate dielectric. The MOS diode channel base may be implanted with a material such as nitrogen, antimony, and/or arsenic to obtain better low field mobility. The MOS diode channel base may also be implanted with a higher level of dopant than the MOSFET channel base. The MOSFET gate conductor and MOS diode gate conductor may be made of polysilicon doped with opposite dopant types. The MOS diode gate dielectric may be implanted with cesium or other ions to produce a positive oxide charge in order to reduce its threshold voltage.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to limitations that solve any or all disadvantages noted in any part of this disclosure.

BRIEF DESCRIPTION OF THE DRAWINGS

The summary, as well as the following detailed description, is further understood when read in conjunction with the appended drawings. For the purpose of illustrating the invention, there are shown in the drawings exemplary embodiments of the invention; however, the invention is not limited to the specific methods, compositions, and devices disclosed.

DETAILED DESCRIPTION

Figure 1:
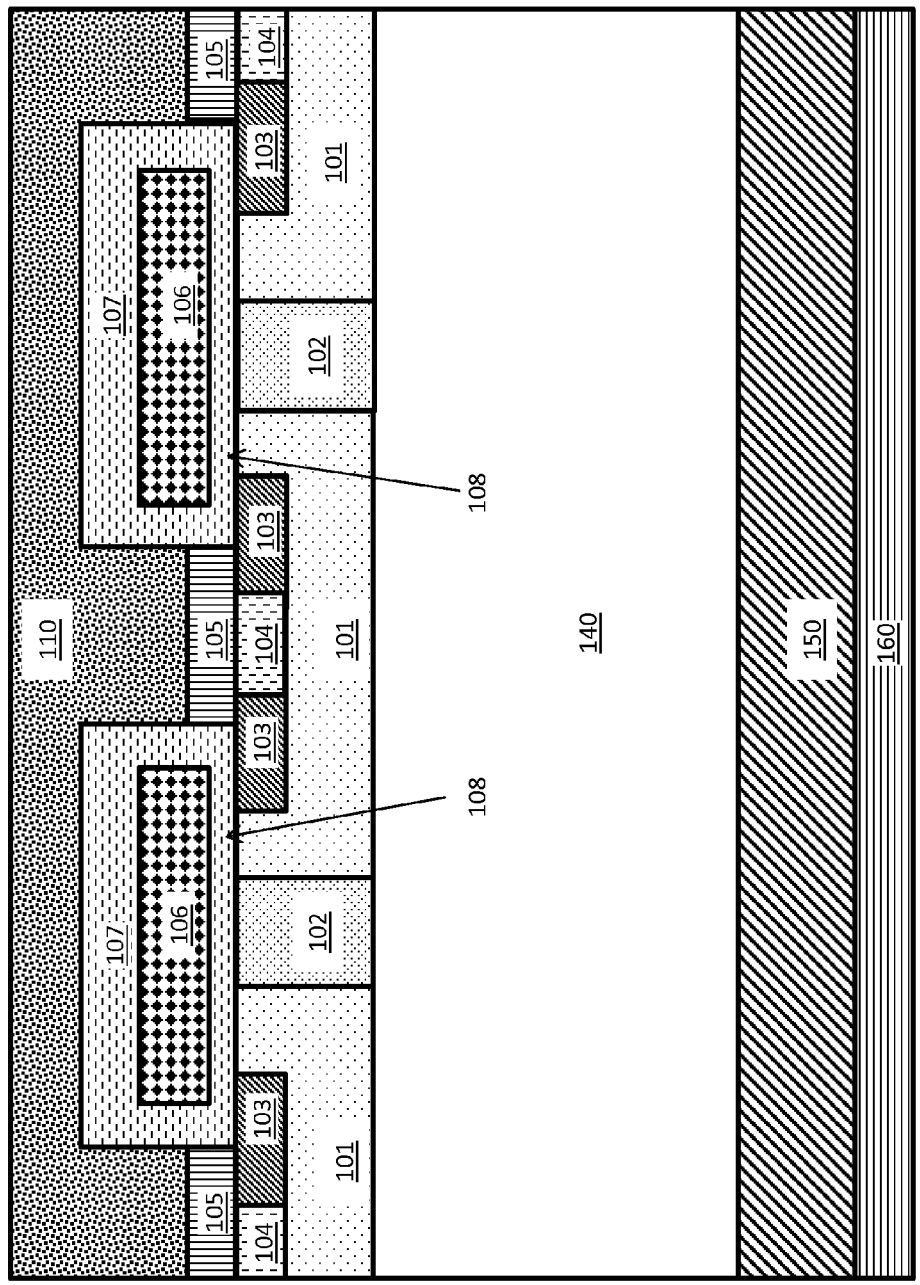
FIG. 1 is a vertical cross-section of active cells in a prior art SiC MOSFET.

The present invention may be understood more readily by reference to the following detailed description taken in connection with the accompanying figures and examples, which form a part of this disclosure. It is to be understood that this invention is not limited to the specific devices, methods, applications, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

This invention uses a MOS channel in gate-source-shorted mode as a diode for the third quadrant conduction path. This MOS diode can be monolithically integrated with a MOSFET, and thereby be constructed using many of the same process steps used to make the MOSFET. The MOSFET and MOS diode can take a number of forms, including planar, split-cell planar, trench, vertically shielded trench configurations. The MOSFET and the MOS diode may both be made on the same wafer substrate. Silicon carbide, gallium nitride, aluminum nitride, aluminum gallium nitride, diamond, or other semiconductor materials may be used.

The threshold voltage of the MOS diode can be adjusted to develop a lower knee voltage. This can lead to even lower conduction losses, and neatly circumvent any stored charge and basal plane degradation issues. This may be achieved by a variety of means. For example, the threshold of the MOS diode can be substantially smaller than that of the MOSFET, e.g., a threshold voltage in the range of 0.3-1.5V for the MOS diode, and a threshold voltage of 2-6V for the MOSFET. The MOS diode may have a very thin gate dielectric, e.g., 80 to 150 angstroms thick. The MOS diode channel base may be implanted with a mobility enhancing material such as nitrogen, antimony, and/or arsenic. The surface of the MOS diode channel base may also be implanted with a higher level of dopant than the MOSFET channel base adjacent to the MOSFET gate oxide if the MOS diode gate dielectric is thinner or has a higher dielectric constant. The MOSFET gate conductor and MOS diode gate conductor may be made of polysilicon, and they may be doped with opposite dopant types. The surface of the MOS diode dielectric can be implanted with cesium or other ions that creates a positive fixed charge which in turn reduces the threshold voltage. At the expense of process complexity, the MOS diode channel can also be made shorter than the MOSFET channel.

For simplicity, all descriptions herein will be for n-MOS devices. It will be appreciated that dopant polarities disclosed may be reversed to create p-MOS devices. Similarly, where SiC devices are discussed in examples, it is understood that these structures and processes may also be implemented in GaN, AlN, AlGaN, diamond, or other semiconductor materials.

FIG. 1 shows a cross-section of active cells of a prior art SiC power MOSFET. N-channel devices of this kind are commonly built on an epitaxial layer structure starting from an n-type substrate 150, followed by an n-type drift layer 140 that is doped to withstand the desired blocking voltage. Above the drift layer 140, an n-doped JFET region 102, a p-type base region 101, n+ source regions 103, and a p+ contact region 104 are incorporated as shown. Atop these semiconductor regions lies a gate oxide region 108, a gate conductor 106 such as polysilicon, and an inter gate-source dielectric region or inter-layer dielectric (ILD) region 107. A silicide region 105 serves as the electrode to the source 103. The silicide region 105 is in contact with a source metal region 110 that covers the active area. The silicide 105 also serves as the contact to the body/channel base 101 via a contact 104. Shown at the bottom is a drain contact 160 that serves as the drain electrode. A contact to the gate is not shown, but is understood to be made in peripheral regions of the device by etching a contact to the gate conductor, e.g., the polysilicon, and connecting the gate metal regions to it, which is well known in the art.

The operation of this device is well understood. In an enhancement mode MOSFET, the channel is formed by applying a positive bias to the gate conductor 106 with respect to the source 110, above the threshold voltage (typically 2-6V), inducing a layer of electrons under the gate oxide 108. This bridges the source region 103 to the JFET region 102. Current can then flow directly from source to drain via the channel, JFET and drift regions. In the third quadrant, with VGS=0V in an enhancement mode MOSFET, the body-diode conduction occurs with the source electrode 110 serving as anode, the drain electrode 160 serving as cathode, and the PN junction between the p-base 101 and drift region 140 being forward biased. In the off-state, with VGS=0V, the drift region 140 is depleted as the same PN junction is reversed biased. The voltage is supported by the MOSFET with very low leakage current. Once the E-field at the junction reaches a critical value (about 3E6 V/cm), avalanche breakdown occurs and the current increases.

Figure 2:
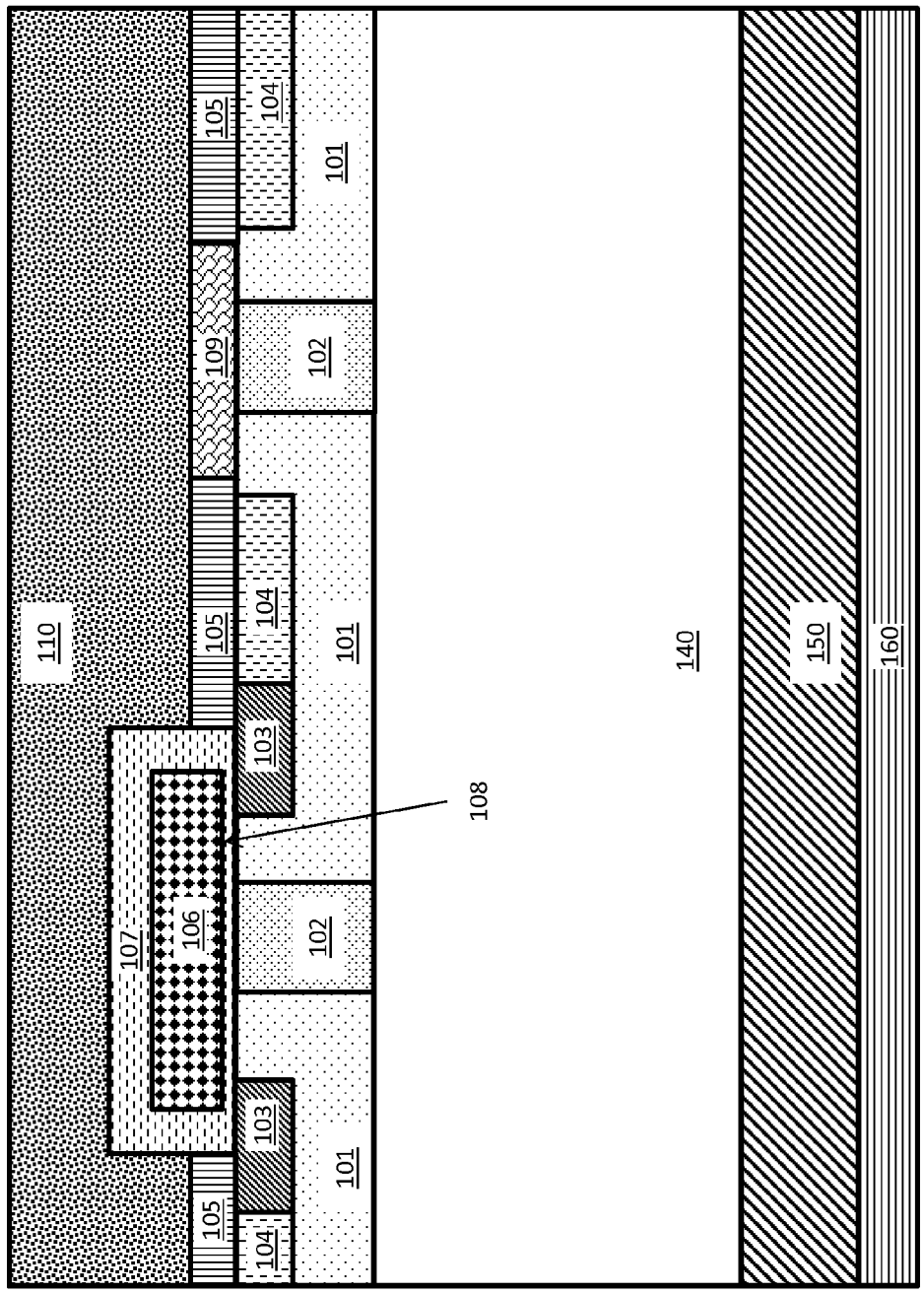
FIG. 2 is a vertical cross-section of a prior art SiC MOSFET with an integrated junction barrier Schottky (JBS) diode.

FIG. 2 shows a prior art SiC MOSFET with an integrated JBS diode. Many configurations have been proposed, including some based on trench MOSFETs, which essentially integrated a JBS diode in parallel with the MOSFET cells. The left portion of FIG. 2 shows the same MOSFET cell as in FIG. 1. The adjacent cell on the right half shows one type of integrated JBS diode. A Schottky metal region 109 is connected to the source metal 110. It is shown abutting the JFET region 102. The Schottky contact region is shielded by the p-base regions 101 on either side of the JFET region 102 and in contact with the Schottky metal 109. Note that the Schottky metal 109 is shown as a distinct region from the silicide contact region 105. While it is possible to use the same metal to form the Schottky region and the silicide contact, there is more freedom in selecting a different Schottky and ohmic contact metal, to achieve more optimal device performance at the expense of some added process complexity. In the third quadrant, the Schottky junction formed under region 109 is forward biased at a lower voltage drop than the PN junction between the p-base 101 and drift region 140. Thus the current flow remains confined to the Schottky region.

Figure 3:
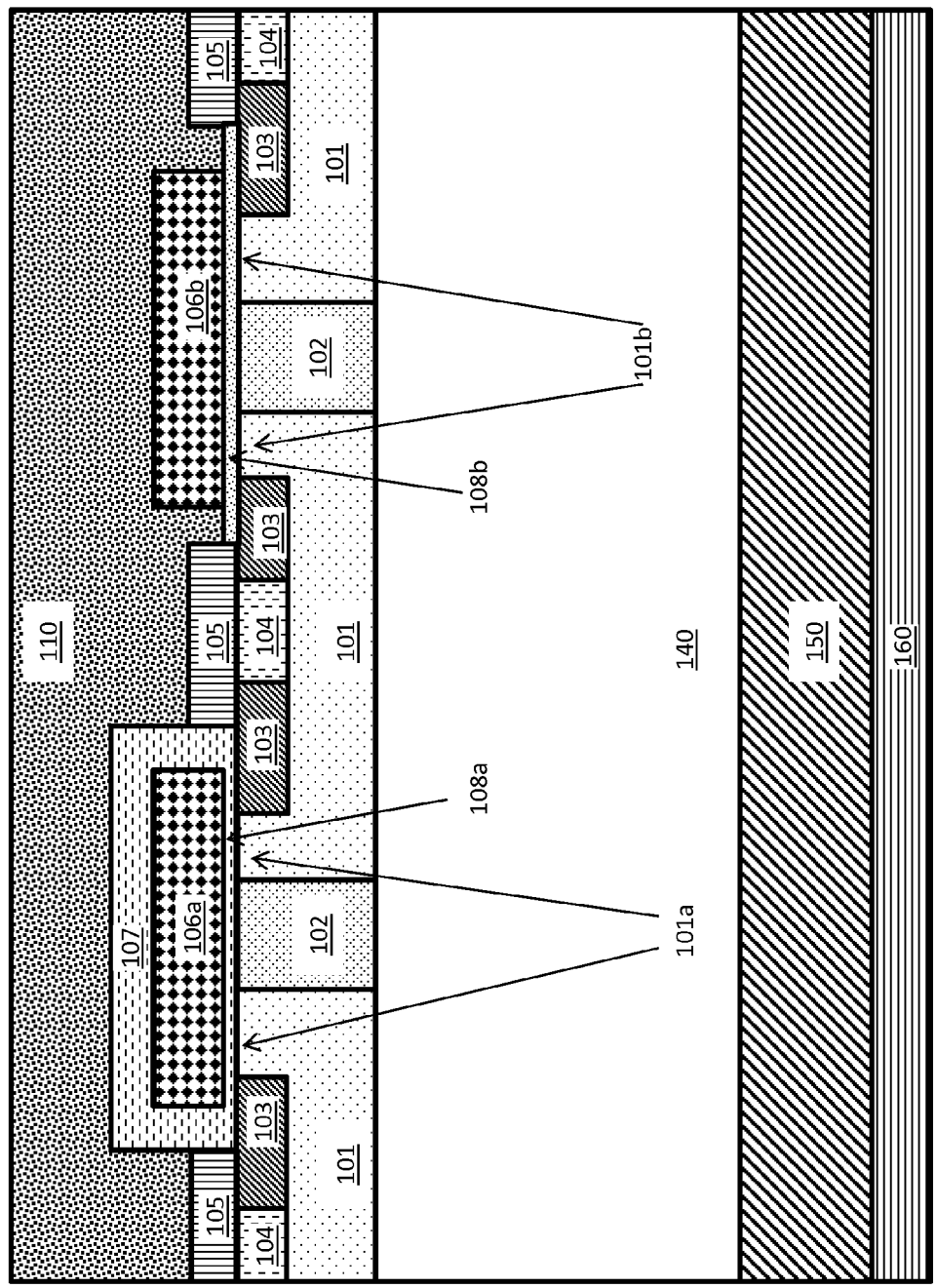
FIG. 3 is a vertical cross-section of a first exemplary embodiment, in which a silicon carbide MOSFET is integrated with a MOS diode.

FIG. 3 shows a first exemplary embodiment of the present invention. The left side of FIG. 3 shows a conventional SiC MOSFET cell, like those shown in FIG. 1 and on the left side of FIG. 2. The cell on the right in FIG. 3 is a MOS diode, i.e., a MOS channel in gate-source-shorted mode, that is used as a diode for the third quadrant conduction path. Here in FIG. 3 there are two gate conductors: a MOSFET gate conductor 106a, and a MOS diode gate conductor 106b. These are not connected to the same potential. The MOS diode gate conductor 106b is connected to the source metal 110.

The gate dielectrics are also different. A MOSFET gate dielectric 108a may be of a different thickness, material, or treatment than a MOS diode gate dielectric 108b. As a result, the right hand cell forms a gate-source-shorted MOS diode, which has a low threshold voltage in the range of 0.3-1.5V typically. The enhancement mode MOSFET basic channel 101a will normally have a much higher threshold of 2-6V. In normal first quadrant operation, the channel region 101b has no electrons, and therefore does not carry any current since the gate and source regions are shorted above it. In the blocking mode, as the PN junction between the p-base 101 and drift region 140 is reversed biased, this channel 101b stays off, allowing the device to block high voltage. In the third quadrant, a positive bias is applied to the drain contact 160 with respect to the source 110, and the channel region 101b operates with the drift 140 and JFET 102 regions now acting as a source, and the source region 103 acting as a drain. Once the threshold voltage of the channel 101b is exceeded, a channel of electrons connects the source 103 to the JFET region 102, and current conduction can occur in the third quadrant. In other words, onset of conduction would occur at the threshold voltage of channel 101b, and the device resistance would comprise the channel, JFET, drift, and substrate resistances in this conduction state. A unipolar diode-like characteristic is thus obtained, with a somewhat higher on-resistance stemming from channel 101b compared to an integrated JBS Schottky. Consequently, minimizing the resistance of channel 101b is beneficial.

Figure 4:
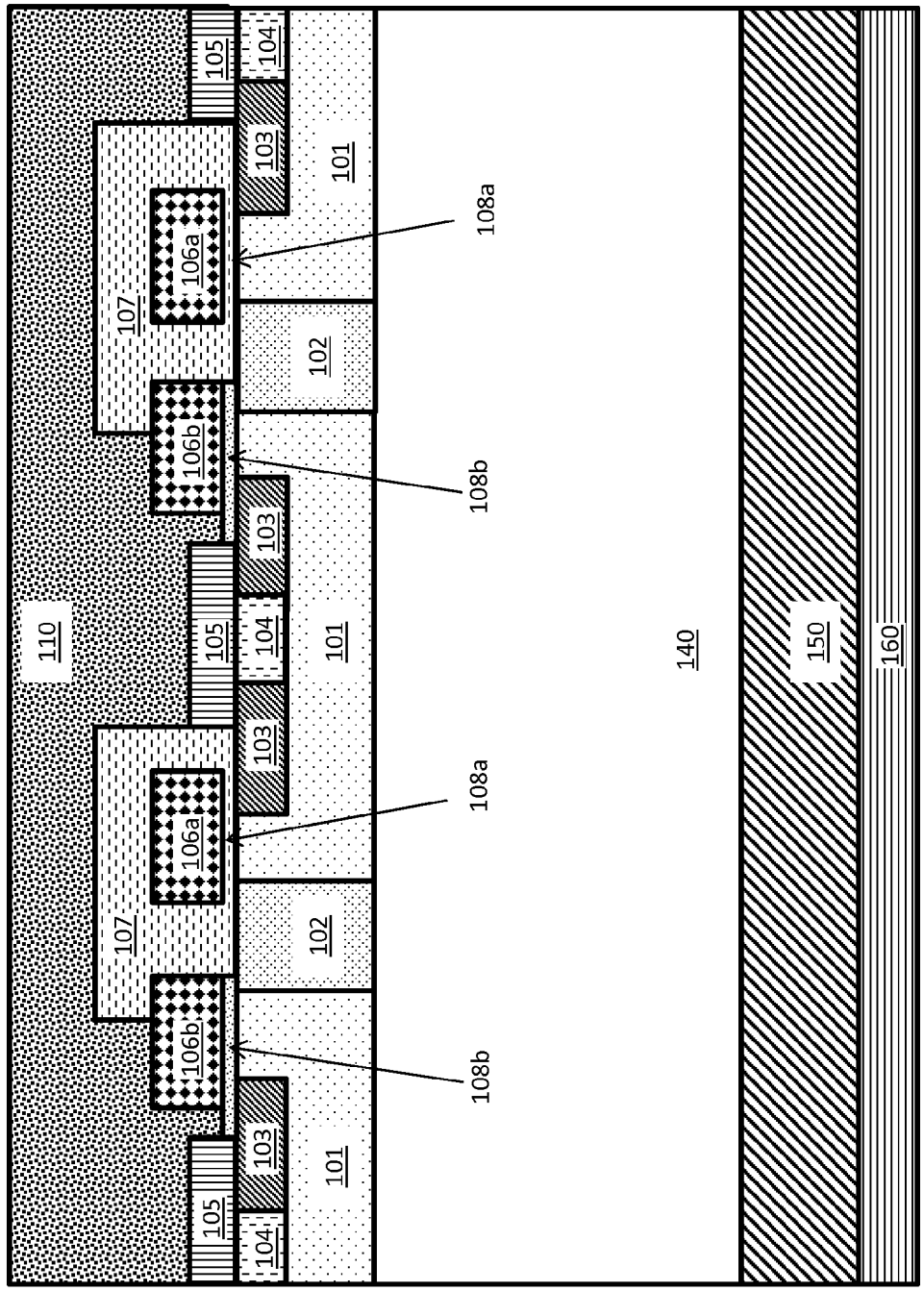
FIG. 4 is a vertical cross-section of a second exemplary embodiment, in which a silicon carbide MOSFET is integrated with a MOS diode.

FIG. 4 shows a second exemplary embodiment of this invention, where a split-gate cell structure is used for the SiC MOSFET. The gate conductor regions are split as shown into regions 106a and 106b. The gap between the regions 106a and 106b serves to reduce the device Miller gate-drain capacitance (Cgd), and improves switching speed. The polysilicon regions located on the left 106b are shorted to the source to form the MOS diode channels and use a different gate dielectric 108b. The gate conductor regions on the right 106a form the regular MOSFET channels under the gate oxide regions 108a. This structure uses the JFET region 102 and drift region 140 more effectively for current conduction in both the first and third quadrants, since JFET region 102 is now shared by a regular MOSFET channel and a MOS diode channel.

Figure 5:
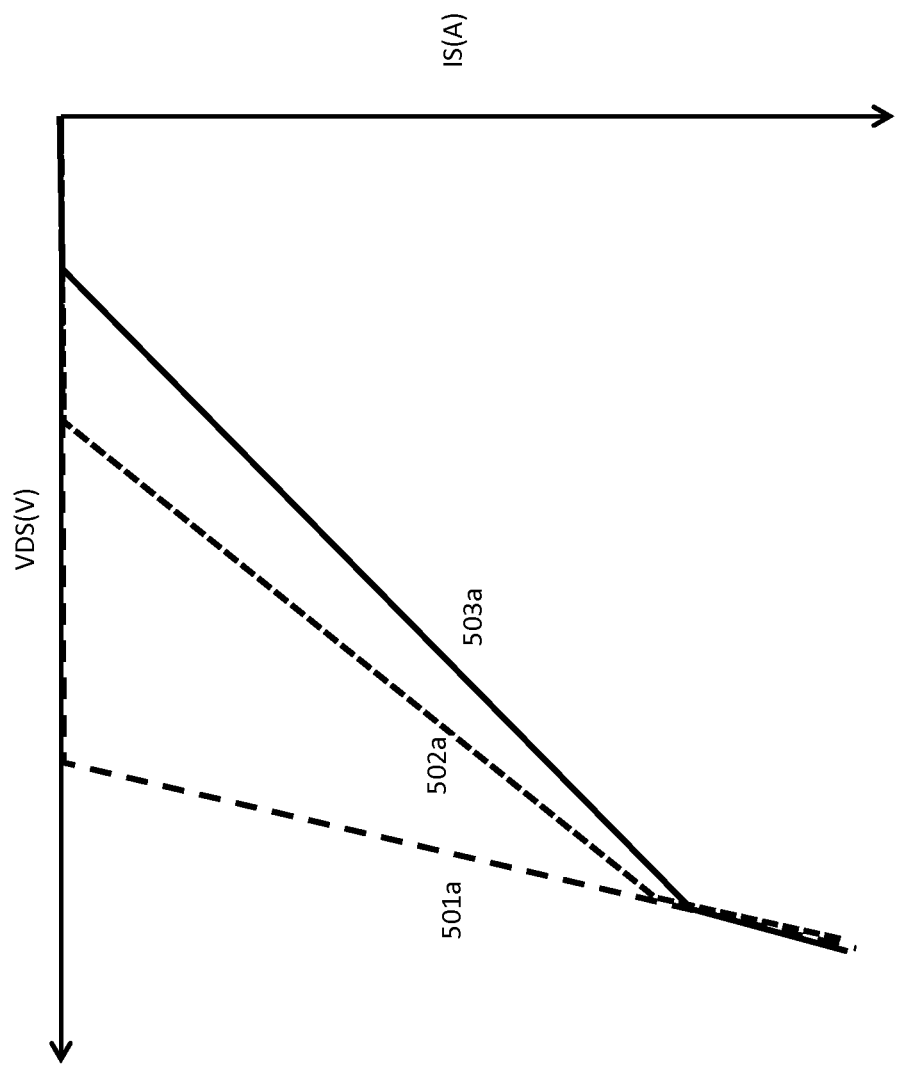
FIG. 5 is a third quadrant current-voltage (IV) curve comparing the performance of various devices.

FIG. 5 shows the impact of this invention on the third quadrant conduction characteristics of the SiC MOSFET. Curve 501a corresponds to the prior art MOSFET body diode configuration shown in FIG. 1, with knee voltage of about 3.5V, and a low differential resistance thereafter. Curve 502a corresponds to the prior art SiC MOSFET with integrated JBS diode shown in FIG. 2, with a knee voltage of about 1V, and a differential resistance equal to that of the MOSFET, until the voltage becomes high enough for the body diode to turn-on. Such a configuration offers unipolar operation until the body diode turns on. Curve 503a corresponds to a configuration using a MOS diode, e.g., as shown in FIG. 3 or 4. The knee voltage may be reduced by, for example, setting a threshold voltage of 0.5V for the MOS diode channel (e.g., regions 108b in FIGS. 3 and 4.) The device conducts in unipolar mode with a somewhat higher resistance, until the body diode turns on.

Figure 6:
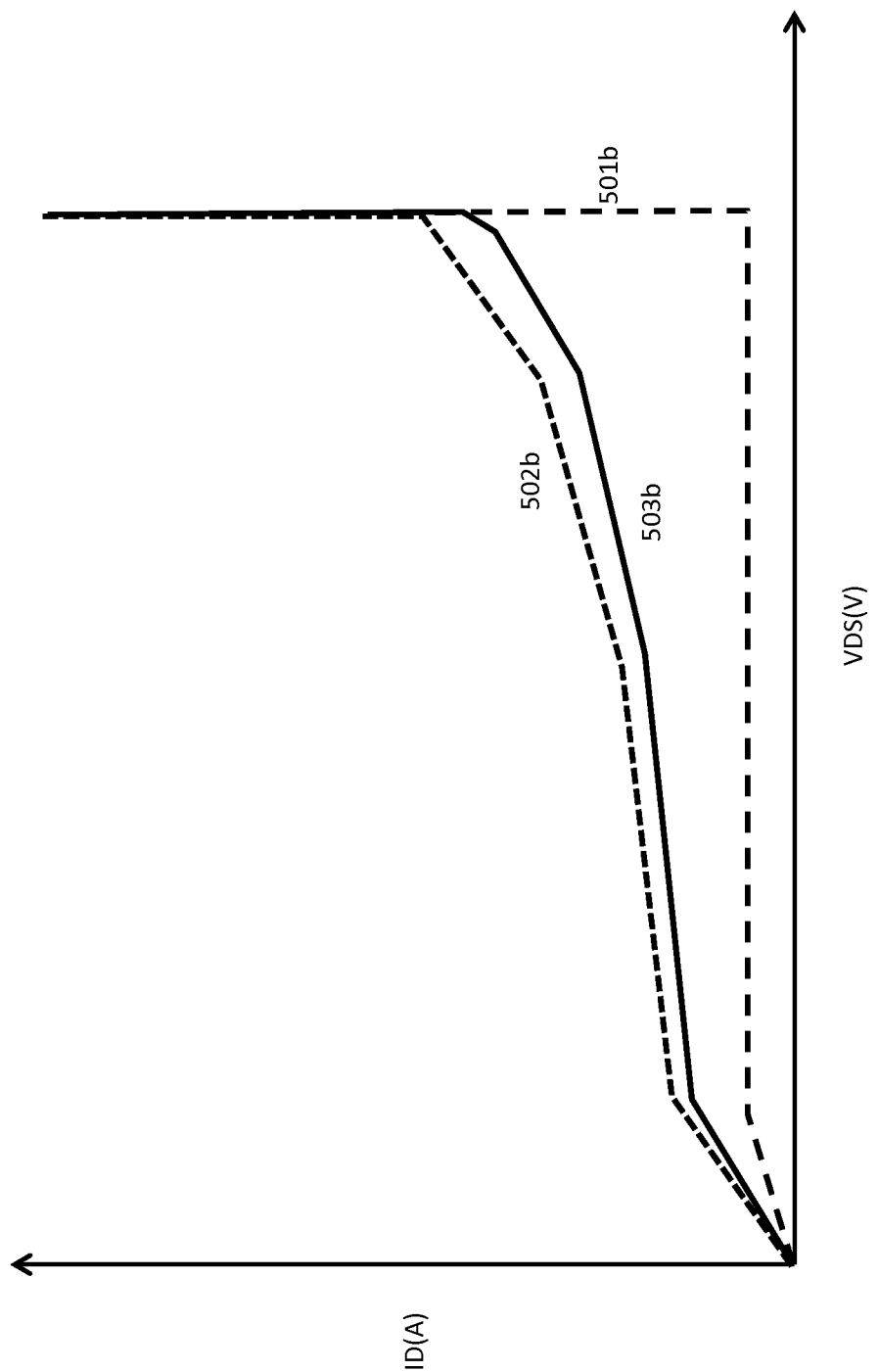
FIG. 6 is a first quadrant IV curve comparing the performance of various devices.

FIG. 6 shows the relative first quadrant off-state leakage currents. The prior art MOSFET configuration of FIG. 1 has the lowest leakage curve 501b, while the prior art configuration with integrated JBS diode of FIG. 2 has a somewhat higher curve 502b. The configurations of the current invention, e.g., as shown in FIGS. 3 and 4 also have a somewhat higher leakage curve 503b.

Figure 7:
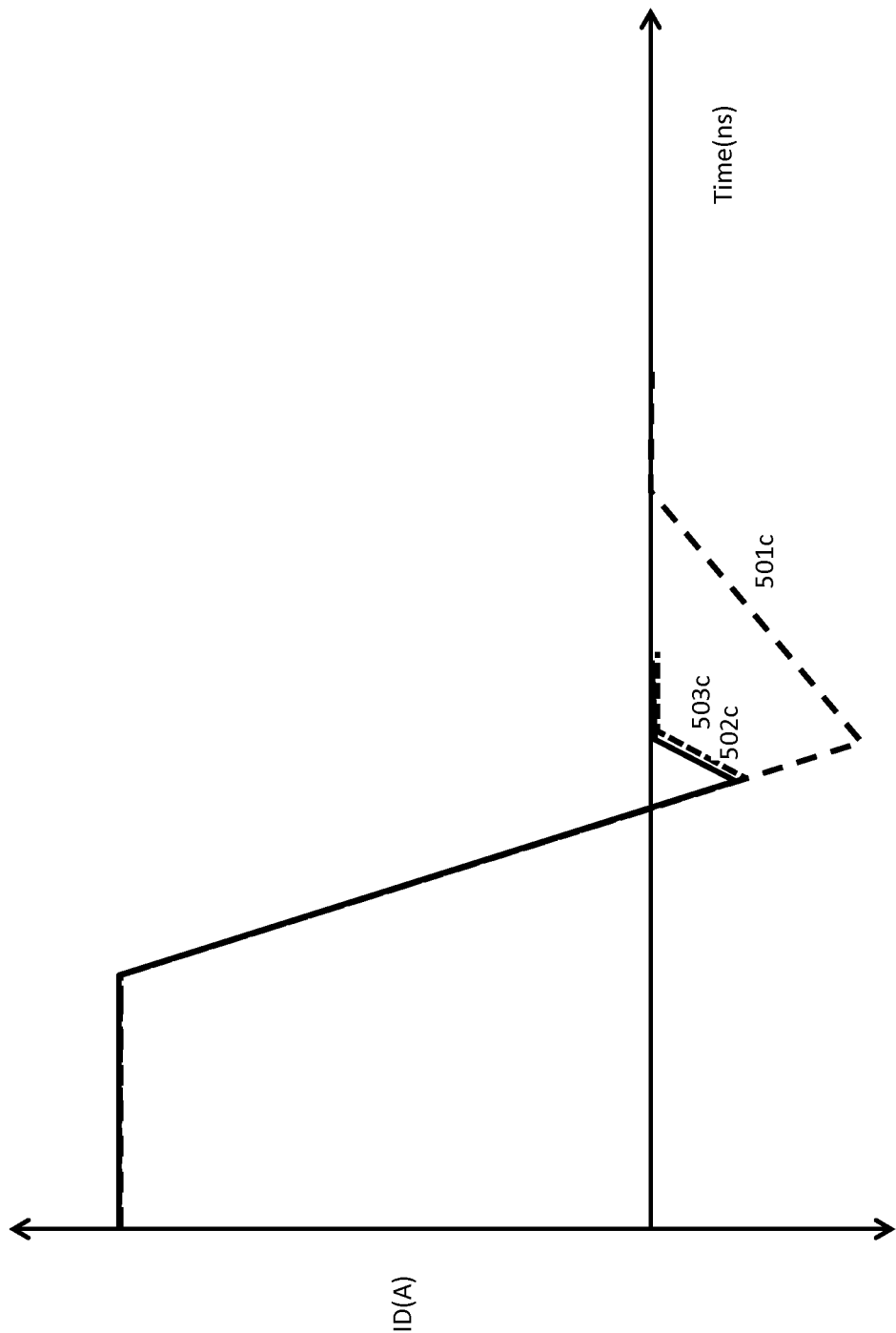
FIG. 7 is a graph of diode reverse recovery performance for various devices.

FIG. 7 shows the comparative reverse recovery waveforms. The prior art MOSFET configuration of FIG. 1 has the worst recovery waveform 501c, due to the configuration having the highest reverse recovery charge, corresponding to the section of the curve below the zero current line. The prior art configuration with integrated JBS diode of FIG. 2 has no stored charge in the channel per se, and therefore its recovery waveform 502c simply reflects the device capacitances that must be charged to bring the device into the blocking state. The MOS diode configuration recovery waveform 503c is similar to that of JBS diode configuration.

Since the MOS diode operates at very small levels of gate bias, it is important to achieve a high transconductance at a low gate bias. This is traditionally a difficult problem in SiC. In order to get the best performance out of the MOS diode channel, some or all of the following recommendations may be applied.

Since the peak voltage developed across the dielectric used for the MOS diode channel (108b in FIGS. 3 and 4) is quite small even in the off-state, this dielectric can be made very thin. The peak voltage is even lower in the structure of FIG. 4, versus FIG. 3, since the peak is developed in the center of the JFET region 102, and the gate conductor is removed in this location. A peak voltage drop as low as 5V may be developed. In this case, an oxide rupture voltage rating of 10V is enough, allowing the use of an 80 to 150 angstrom thick film, for example, depending on dielectric breakdown strength. This makes it easier to get a lower threshold, and a much higher channel electron concentration, without excessive leakage current tunneling through the dielectric.

Since the MOS diode channel is formed under a gate-source shorted gate conductor 106b, it does not contribute to device input capacitance. It also therefore makes sense, for example, to use dielectrics with high relative permittivity. Dielectrics with higher permittivity than silicon dioxide include, e.g., silicon nitride and hafnium oxide. Many other suitable high permittivity dielectrics are also known for use in CMOS and memory applications, for instance.

Figure 8:
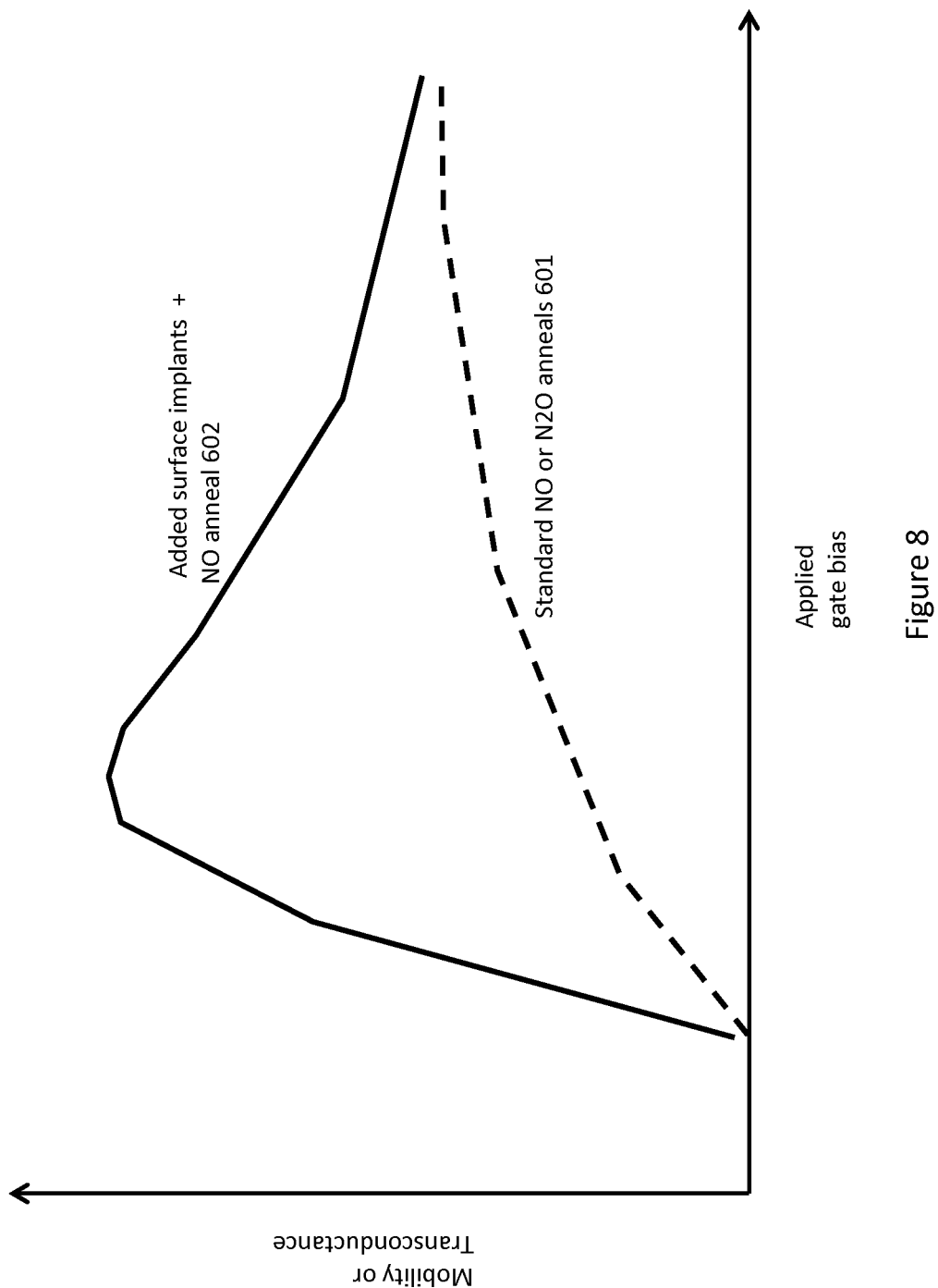
FIG. 8 is a chart of mobility and transconductance versus applied gate voltages resulting from different interface preparation methods.
Figure 9:
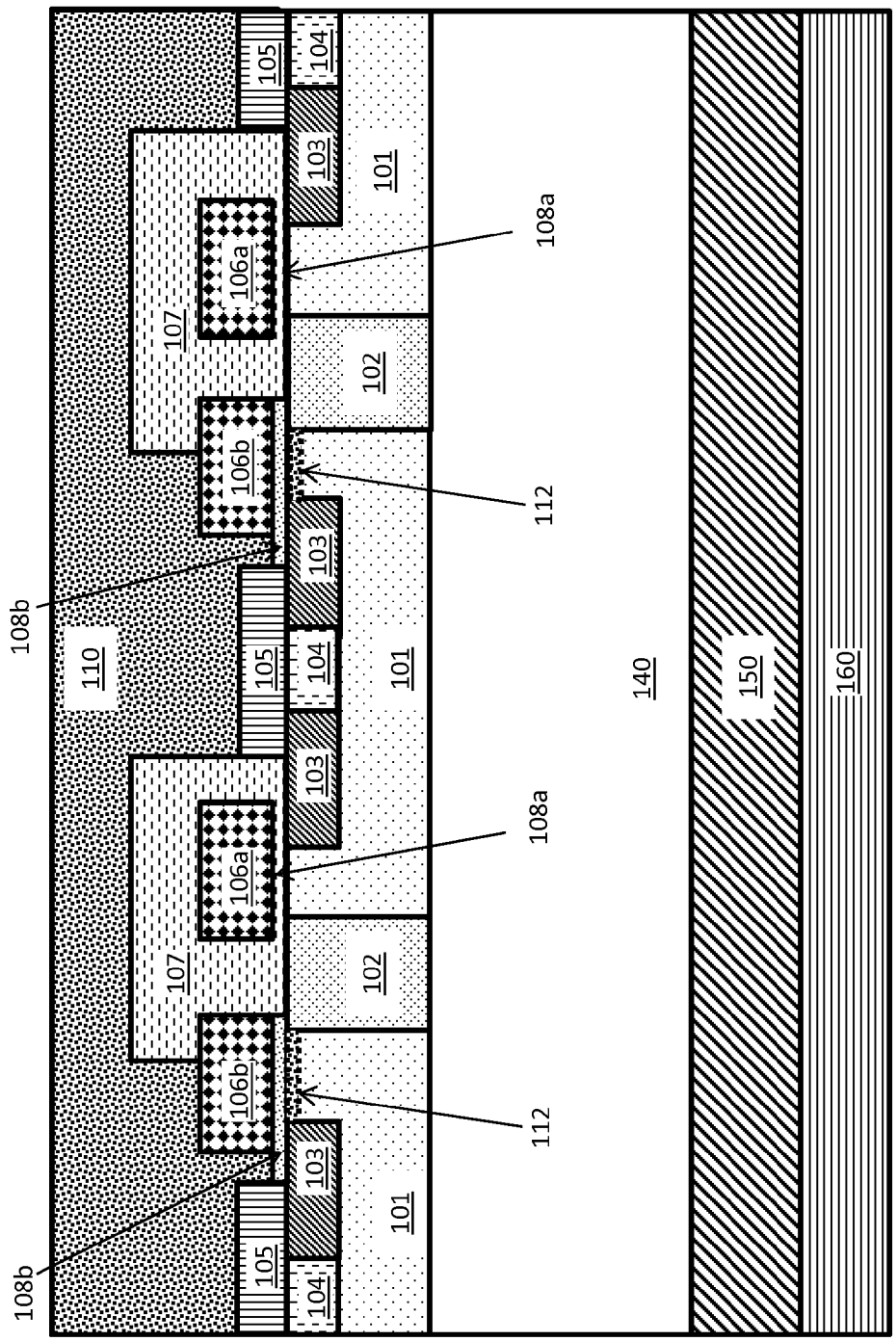
FIG. 9 is a vertical cross-section of a third exemplary embodiment, in which a silicon carbide MOSFET is integrated with a MOS Schottky diode.

FIG. 8 shows another important process that can be applied to obtain peak performance for the MOS diode. Since a standard nitric oxide (NO) annealed MOS interface tends to trap electrons, the effective mobility and transconductance at low gate bias may be poor in SiC, as shown by curve 601. This means that the channel voltage drop of the third quadrant will be high at the low effective gate bias conditions that exist in the MOS diode channel. However, surface implantation has been shown to dramatically improve this mobility at low gate bias, as seen in curve 602. Species such as nitrogen, phosphorous, antimony, and arsenic may be applied, and others may be experimentally determined to perform the same function. This implant can be used selectively on the device surface, as shown by region 112 in FIG. 9, to both shift the threshold down to the desired knee voltage, and simultaneously improve the mobility and transconductance at reduced gate bias for the MOS diode channel.

Another useful technique that may be applied is to use a gate material with a work function changed to achieve a lower threshold voltage for the MOS diode region. This can be accomplished, for example, by using a p+ polysilicon gate conductor for the regular MOSFET channel while using an n+ polysilicon gate for the MOS diode channel, in the case of an enhancement mode MOSFET. The use of different gate conductor materials for the MOSFET versus the MOS diode is also possible, but would be more complex from a process viewpoint. Similarly, selective implantation of species such as cesium create a positive fixed charge in silicon dioxide, and therefore may be used to obtain a lower threshold in the MOS diode channel. All off these techniques may be applied separately or together to achieve a particular level of performance.

Figure 10:
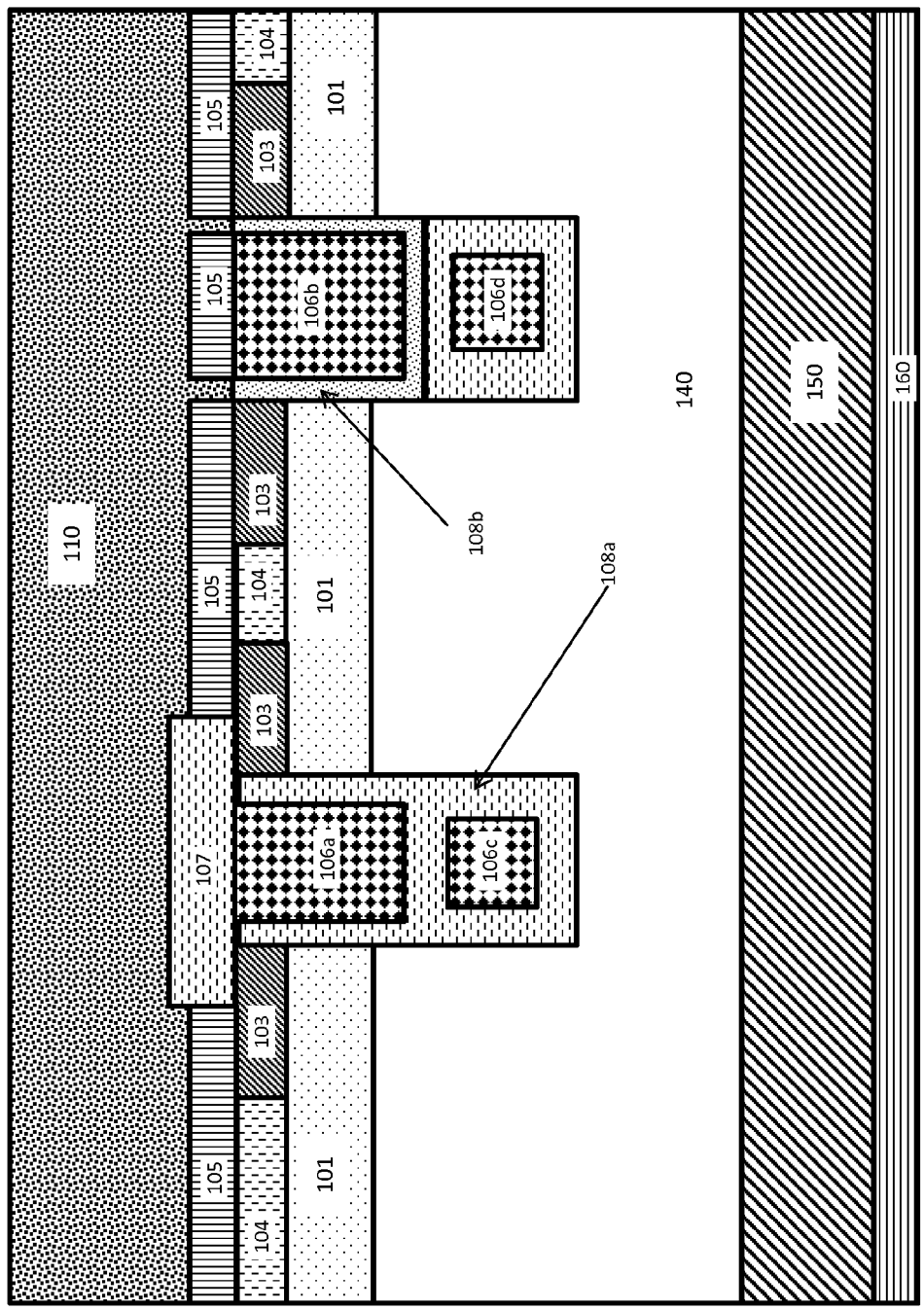
FIG. 10 is a vertical cross-section of a fourth exemplary embodiment, in which a trench silicon carbide SiC MOSFET is integrated with a MOS diode.

Given the better mobility seen on the a-face and m-face of silicon carbide, these concepts can also be profitably applied to trench versions of MOSFETs. An example is shown in FIG. 10. In this case, the use of thinner dielectric for the MOS diode channel necessitates the use of a structure to protect this dielectric from high fields in the off-state. The shielded gate structure of FIG. 10 shows the formation of channels on the vertical trench sidewalls, which offer higher channel mobility in silicon carbide. The left side trench is used for the MOS channel, with the gate conductor region 106a tied to gate potential, and a shield conductor region 106c is tied to source potential. The right side trench has its top gate conductor region 106b tied to the source potential via the shorting contact 105. This trench may be lined with the high permittivity, thinner dielectric 108b. The bottom of this trench has a source connected electrode 106d, surrounded by a thicker dielectric. This shields the thinner dielectric 108b from any high fields, allowing the use of thinner films for peak performance. An angled implant of nitrogen, phosphorus, antimony or arsenic into the sidewall of the trench used for the MOS diode channel can be used to improve low field mobility, exactly as proposed for the planar MOSFET.

EXAMPLES

A compound semiconductor device may include a MOSFET monolithically integrated with a MOS diode. The MOSFET and MOS diode may be formed on the same substrate using identical or analogous process steps. An n-MOSFET may include an n-doped drift and an n-doped source, a p-doped channel base, a gate conductor, and a gate oxide, with the drift connected to an n-doped substrate drain. An n-MOS diode paired with the MOSFET may share the same substrate drain and drift region. Similarly, the MOS diode gate conductor and channel base may be formed at the same time as the analogous structures for the MOSFET. The MOS diode is formed by connecting the MOS diode gate conductor to both the diode source and the MOSFET source. The MOSFET and the MOS diode may both be made of silicon carbide, gallium nitride, aluminum nitride, aluminum gallium nitride, diamond, or other semiconductor material.

Compound devices pairing a MOSFET and a MOS diode can be achieved in a number of configurations including, but not limited to, planar, split-cell planar, trench, and vertically shielded trench. For a split-cell device, the MOSFET gate oxide and the MOS diode gate dielectric may be arranged to extend over a common drift area, where the common drift area provides drain conduction for both the MOSFET and the MOS diode. For a trench device, the drifts, the channel bases, and the sources may be successively layered horizontally over the substrate, and the gate conductors placed in trenches which are cut vertically into the drifts through the sources and channel bases, where the gate conductors are separated from the other structures by dielectric gaps. Vertical shields may be added to the trenches by placing shield conductors under the gate conductors in each trench and connecting the shield conductors to the sources.

It may be advantageous to make the MOSFET gate oxide and the diode gate dielectric distinct in thickness and/or composition, or to otherwise vary the operation of the channels by use of different doping, implantations, or other treatments. This applies to all device configurations. For example, it may be beneficial to establish a MOSFET threshold voltage in the range of 2V to 6V where the MOS diode, by contrast, has a threshold voltage in the range of 0.3V to 1.5V. It may be advantage to use a very thin MOS the diode gate dielectric, e.g., in the range of 80 to 150 angstroms.

The MOS diode channel base may be implanted with a mobility enhancing material such as nitrogen, antimony, and arsenic. The MOS diode channel may additionally or alternatively have a higher level of n-type doping via diffusion or implanting operations. Another option is for the gate conductors to be doped differently. For example, the MOSFET gate conductor is p-doped polysilicon and the MOS diode gate conductor is n-doped polysilicon.

In describing preferred embodiments of the subject matter of the present disclosure, as illustrated in the figures, specific terminology is employed for the sake of clarity. The claimed subject matter, however, is not intended to be limited to the specific terminology so selected, and it is to be understood that each specific element includes all technical equivalents that operate in a similar manner to accomplish a similar purpose. When ranges are used herein for physical properties, such as chemical properties in chemical formulae, all combinations, and subcombinations of ranges for specific embodiments therein are intended to be included Those skilled in the art will appreciate that numerous changes and modifications can be made to the preferred embodiments of the invention and that such changes and modifications can be made without departing from the spirit of the invention. It is, therefore, intended that the appended claims cover all such equivalent variations as fall within the true spirit and scope of the invention.

What is claimed is:

1. A device, comprising:
a MOSFET monolithically integrated with a MOS diode;
the MOSFET comprising an n-doped drift region and an n-doped source, a p-doped channel base, a gate conductor, and a gate oxide, where the drift is connected to an n-doped substrate drain;
the MOS diode comprising an n-doped drift region and an n-doped source, a p-doped channel base, a gate conductor, and a gate dielectric, where the drift is connected to the substrate drain;
wherein, the MOS diode gate conductor is connected to the MOS diode source and to the MOSFET source;
wherein, the MOSFET and the MOS diode are both made of silicon carbide, gallium nitride, aluminum nitride, aluminum gallium nitride, or diamond; and
wherein, the MOSFET gate oxide and the diode gate dielectric are distinct in at least one of thickness or composition.

2. The device of claim 1, wherein:
the MOSFET and the MOS diode are both made of silicon carbide.

3. The device of claim 1, wherein:
the MOSFET has a threshold voltage in the range of 2V to 6V; and
the MOS diode has a threshold voltage in the range of 0.3V to 1.5V.

4. The device of claim 1, wherein:
the MOSFET has a threshold voltage in the range of 3V to 5V; and
the MOS diode has a threshold voltage in the range of 0.5V to 1.2V.

5. The device of claim 1, wherein:
the diode gate dielectric has a thickness in the range of 80 to 150 angstroms.

6. The device of claim 1, wherein:
the diode gate dielectric has a thickness in the range of 20 to 500 angstroms.

7. The device of claim 1, wherein:
the MOS diode channel base is implanted with a mobility enhancing material selected from the list consisting of nitrogen, antimony, and arsenic.

8. The device of claim 1, wherein:
the MOS diode channel base is doped to a higher or lower level than is the MOSFET channel base.

9. The device of claim 1, wherein:
the MOSFET gate conductor is p-doped polysilicon and the MOS diode gate conductor is n-doped polysilicon.

10. The device of claim 1, wherein:
the MOS diode dielectric is implanted with cesium.

11. The device of claim 1, wherein:
the MOSFET gate oxide and the MOS diode gate dielectric extend over a common drift area,
where the common drift area is the drift region of the MOSFET and the drift region of the MOS diode.

12. The device of claim 1, wherein:
the drift regions, the channel bases, and the sources are successively layered horizontally over the substrate;
the MOSFET gate conductor and MOSFET gate oxide are placed in a first trench cut vertically into the MOSFET drift region through the MOSFET source and MOSFET channel base; and
the MOS diode gate conductor and MOS diode gate dielectric are placed in a second trench cut vertically into the MOS diode drift region through the MOS diode source and the MOS diode channel base.

13. The device of claim 11, wherein:
the MOSFET has a threshold voltage in the range of 2V to 6V; and
the MOS diode has a threshold voltage in the range of 0.3V to 1.5V.

14. The device of claim 11, wherein:
the MOSFET has a threshold voltage in the range of 3 V to 5 V; and
the MOS diode has a threshold voltage in the range of 0.5 V to 1.2 V.

15. The device of claim 11, wherein:
the diode gate dielectric has a thickness in the range of 80 to 150 angstroms.

16. The device of claim 11, wherein:
the diode gate dielectric has a thickness in the range of 20 to 500 angstroms.

17. The device of claim 11, wherein:
the MOS diode channel base is implanted with a mobility enhancing material selected from the list consisting of nitrogen, antimony, and arsenic.

18. The device of claim 11, wherein:
the MOS diode channel base is doped to a higher or lower level than is the MOSFET channel base.

19. The device of claim 11, wherein:
the MOSFET gate conductor is p-doped polysilicon and the MOS diode gate conductor is n-doped polysilicon.

20. The device of claim 11, wherein:
the MOS diode gate dielectric is implanted with cesium.

21. The device of claim 12, wherein:
the MOSFET and the MOS diode are both made of silicon carbide.

22. The device of claim 12, wherein:
the MOSFET has a threshold voltage in the range of 2V to 6V; and
the MOS diode has a threshold voltage in the range of 0.3V to 1.5V.

23. The device of claim 12, wherein:
the MOSFET has a threshold voltage in the range of 3V to 5V; and
the MOS diode has a threshold voltage in the range of 0.5V to 1.2V.

24. The device of claim 12, wherein:
the diode gate dielectric has a thickness in the range of 80 to 150 angstroms.

25. The device of claim 12, wherein:
the diode gate dielectric has a thickness in the range of 20 to 500 angstroms.

26. The device of claim 12, wherein:
the MOS diode channel base is implanted with a mobility enhancing material selected from the list consisting of nitrogen, antimony, and arsenic.

27. The device of claim 12, wherein:
the MOS diode channel base is doped to a higher level than is the MOSFET channel base.

28. The device of claim 12, wherein:
the MOSFET gate conductor is p-doped polysilicon and the MOS diode gate conductor is n-doped polysilicon.

29. The device of claim 12, wherein:
the MOS diode gate dielectric is implanted with cesium.

30. The device of claim 12, wherein:
a first shield conductor is placed beneath the MOSFET gate conductor in the first trench, where the shield conductor is separated from the other structures by a first dielectric gap, and where the first shield conductor is connected to the source of the MOSFET; and
a second shield conductor is placed beneath the MOS diode gate conductor in the second trench, where the second shield conductor is separated from other structures by a second dielectric gap, and where the second shield conductor is connected to the source of the MOS diode.

* * * * *